(12) United States Patent
Hegde

(10) Patent No.: US 8,921,176 B2
(45) Date of Patent: Dec. 30, 2014

(54) MODIFIED HIGH-K GATE DIELECTRIC STACK

(75) Inventor: Rama I. Hegde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/493,814

(22) Filed: Jun. 11, 2012

(65) Prior Publication Data

US 2013/0328137 A1    Dec. 12, 2013

(51) Int. Cl.
  *H01L 21/28* (2006.01)

(52) U.S. Cl.
  USPC ............ 438/216; 438/18; 438/197; 438/585; 438/765; 438/785

(58) Field of Classification Search
  CPC . H01L 21/28; H01L 21/255; H01L 21/28088; H01L 21/28097; H01L 21/31155
  USPC .................. 438/18, 197, 216, 585, 785, 765; 257/E21.268, E21.272
  See application file for complete search history.

(56) References Cited

U.S. PATENT DOCUMENTS

| | | | |
|---|---|---|---|
| 4,683,645 A * | 8/1987 | Naguib et al. | 438/297 |
| 5,172,269 A | 12/1992 | Ogura et al. | |
| 5,254,202 A | 10/1993 | Kaplan | |
| 5,907,780 A * | 5/1999 | Gilmer et al. | 438/299 |
| 6,300,202 B1 | 10/2001 | Hobbs et al. | |
| 6,376,342 B1 * | 4/2002 | Tseng | 438/517 |
| 6,432,779 B1 | 8/2002 | Hobbs et al. | |
| 6,495,474 B1 * | 12/2002 | Rafferty et al. | 438/766 |
| 6,699,450 B2 | 3/2004 | Dunn et al. | |
| 7,041,546 B2 | 5/2006 | Morozumi et al. | |
| 7,115,929 B2 | 10/2006 | Bhat et al. | |
| 7,144,825 B2 * | 12/2006 | Adetutu et al. | 438/763 |
| 7,439,564 B2 | 10/2008 | Bhat et al. | |
| 7,488,656 B2 * | 2/2009 | Cartier et al. | 438/287 |
| 7,504,700 B2 * | 3/2009 | Zhu et al. | 257/410 |
| 7,547,951 B2 * | 6/2009 | Lim et al. | 257/410 |
| 7,749,879 B2 | 7/2010 | Ahn et al. | |
| 7,859,984 B2 | 12/2010 | Kariyada | |
| 7,898,082 B2 * | 3/2011 | Moon | 257/736 |

(Continued)

OTHER PUBLICATIONS

Yu, Xionfei et al., High mobility and excellent electrical stability of MOSFETs using a novel HfTaO gate dielectric, 2004 Symposium on VLSI Technology, Jun. 15-17, 2004.

(Continued)

*Primary Examiner* — Matthew W Such
*Assistant Examiner* — Stephen C Smith

(57) ABSTRACT

A semiconductor fabrication method includes forming a gate dielectric stack on a semiconductor substrate and annealing the gate dielectric stack. Forming the stack may include depositing a first layer of a metal-oxide dielectric on the substrate, forming a refractory metal silicon nitride on the first layer, and depositing a second layer of the metal-oxide dielectric on the refractory metal silicon nitride. Depositing the first layer may include depositing a metal-oxide dielectric, such as $HfO_2$, using atomic layer deposition. Forming the refractory metal silicon nitride film may include forming a film of tantalum silicon nitride using a physical vapor deposition process. Annealing the gate dielectric stack may include annealing the gate dielectric stack in an oxygen-bearing ambient at approximately 750 C for 10 minutes or less. In one embodiment, annealing the dielectric stack includes annealing the dielectric stack for approximately 60 seconds at a temperature of approximately 500 C.

18 Claims, 2 Drawing Sheets

(56) References Cited

U.S. PATENT DOCUMENTS

| | | |
|---|---|---|
| 8,232,209 B2 * | 7/2012 | Brannon et al. .............. 438/692 |
| 8,349,732 B2 * | 1/2013 | Chuang et al. ................ 438/664 |
| 8,476,155 B1 * | 7/2013 | Lim et al. ...................... 438/584 |
| 8,476,678 B2 * | 7/2013 | Li ................................. 257/204 |
| 2001/0011059 A1 | 8/2001 | Dunn et al. |
| 2004/0144980 A1 | 7/2004 | Ahn et al. |
| 2004/0195653 A1 | 10/2004 | Morozumi et al. |
| 2004/0206724 A1 | 10/2004 | Nallan et al. |
| 2005/0218462 A1 | 10/2005 | Ahn et al. |
| 2005/0224913 A1 | 10/2005 | Bhat et al. |
| 2005/0227433 A1 | 10/2005 | Bhat et al. |
| 2005/0271813 A1 | 12/2005 | Kher et al. |
| 2006/0051925 A1 | 3/2006 | Ahn et al. |
| 2006/0060565 A9 | 3/2006 | Nallan et al. |
| 2006/0062917 A1 | 3/2006 | Muthukrishnan et al. |
| 2007/0210354 A1 | 9/2007 | Nabatame et al. |
| 2007/0231529 A1 | 10/2007 | Kariyada et al. |
| 2008/0029790 A1 | 2/2008 | Ahn et al. |
| 2008/0074989 A1 | 3/2008 | Kariyada |
| 2008/0164581 A1 | 7/2008 | Cho et al. |
| 2009/0011608 A1 * | 1/2009 | Nabatame ..................... 438/761 |
| 2009/0085175 A1 * | 4/2009 | Clark et al. ................... 257/637 |
| 2010/0187644 A1 | 7/2010 | Nabatame |
| 2010/0270590 A1 | 10/2010 | Ahn et al. |
| 2011/0049642 A1 * | 3/2011 | Scheiper et al. .............. 257/392 |
| 2012/0315749 A1 * | 12/2012 | Hempel et al. ................ 438/591 |
| 2013/0017678 A1 * | 1/2013 | Tsai et al. ..................... 438/591 |

OTHER PUBLICATIONS

Yu, Xionfei et al., Electrical characteristics and suppressed boron penetration behavior of thermally stable HfTaO gate dielectrics with polycrystalline-silicon gate, Applied Physicas Letters, vol. 85, No. 14, pp. 2893-2895, Oct. 4, 2004.

* cited by examiner

MODIFIED HIGH-K GATE DIELECTRIC STACK

BACKGROUND

1. Field

Disclosed subject matter is in the field of semiconductor fabrication and, more specifically, the fabrication of gate dielectrics for metal oxide semiconductor field effect transistors (MOSFETs).

2. Related Art

As the required thickness for conventional silicon dioxide gate dielectrics has decreased with advancing technology and smaller devices, gate oxide leakage has become unacceptable for standby power dissipation in low power parts, which is a key factor in differentiating among competitors for low power devices including most mobile devices. High-κ dielectrics have been used to produce an effective oxide thickness that is substantially lower than the physical thickness of the film itself and thereby achieve desirable performance characteristics without sacrificing static power dissipation and/or reliability. Hafnium dioxide ($HfO_2$) is an example of a high-κ dielectric material desirable for its comparatively high dielectric constant and its relative stability in a manufacturing environment. It is known, however, that MOSFETs employing conventional $HfO_2$ gate dielectrics often suffer from threshold voltage (Vt) instability, relatively lower mobility (Gm), and degraded positive bias temperature instability (PBTI) reliability.

BRIEF DESCRIPTION OF THE DRAWINGS

The present invention is illustrated by way of example and is not limited by the accompanying figures, in which like references indicate similar elements. Elements in the figures are illustrated with an emphasis on clarity and simplicity where possible and have not necessarily been drawn to scale.

DETAILED DESCRIPTION

Figure 1:
FIG. 1 depicts a partial cross-sectional view of a semiconductor substrate.

In one aspect, a disclosed semiconductor fabrication method includes forming a gate dielectric stack on a semiconductor substrate and annealing the gate dielectric stack. The semiconductor material in the substrate may be, as examples, silicon, germanium, or any of various III-V compounds. The semiconductor substrate may exhibit a crystalline or substantially crystalline structure and may include one or more epitaxial layers formed overlying a bulk portion of the substrate. The semiconductor substrate may include extrinsically doped p-type regions, extrinsically doped n-type regions, intrinsic regions, or a combination thereof. The semiconductor substrate may overlie an insulating layer such as a silicon-oxide layer, a sapphire layer, or the like. The semiconductor substrate may constitute a portion of a semiconductor wafer.

Forming the gate dielectric stack may include performing a substrate pre-clean such as an RCA clean, forming a first portion of a metal-oxide dielectric on the substrate, forming a refractory metal silicon-nitride film on the first portion of the metal-oxide dielectric, and then forming a second portion of the metal-oxide dielectric. In other embodiments, the formation of the gate dielectric stack may include forming the entire metal-oxide film and thereafter implanting a refractory silicon nitride species into the metal-oxide film.

In disclosed embodiments, the metal-oxide dielectric is a high-κ dielectric. A high-κ dielectric generally refers to any material having a dielectric constant that is greater than the dielectric constant of silicon dioxide, which is ~3.9. For purposes of this disclosure, a high-κ dielectric may refer to a dielectric having a dielectric constant greater than approximately 10.

Forming the metal-oxide dielectric may include depositing a metal-oxide dielectric such as $HfO.sub.2$ by atomic layer deposition. Atomic layer deposition of the metal-oxide dielectric is described in greater detail below. A thickness of the first metal-oxide layer may be dependent on the material's dielectric constant. For $HfO.sub.2$, the thickness may be less than approximately 5.0 nanometers and may, in some implementations, be in the range of approximately 2.2 to 2.8 nanometers.

Forming the refractory metal silicon nitride film may include forming a refractory metal silicon nitride, e.g., tantalum silicon nitride, using a physical vapor deposition process. In other embodiments, formation of the refractory metal silicon film may include an atomic layer deposition process. In the case of a physical vapor deposition process, a duration of the deposition may be less than approximately 10 seconds. In the case of a tantalum silicon nitride film, a duration of the physical vapor deposition may be approximately 1 second.

Annealing the gate dielectric stack may include annealing the gate dielectric stack in an oxygen-bearing ambient. An ambient temperature of the anneal process may be less than a temperature in the range of approximately 720 C to 780 C and a duration of the anneal may be in the range of approximately 8 to 12 minutes or less. In one embodiment, annealing the dielectric stack includes annealing the dielectric stack for approximately 50 to 70 seconds at a temperature of approximately 470 C to 530 C.

In another aspect, a disclosed semiconductor device includes an electrically conductive gate electrode overlying a gate dielectric film referred to herein as a modified high-κ gate dielectric stack overlying a semiconductor substrate. The gate electrode may include a metal (e.g., Cu, Al, Ta, TaC, TaN, TiN, or W), polysilicon, a silicide such as tantalum silicide, or a combination thereof.

The modified high-κ gate dielectric may include a metal-oxide dielectric into which a refractory metal such as tantalum, a semiconductor such as silicon, or both, have been introduced. Introducing the refractory metal into the dielectric may be achieved using deposition or implant. For embodiments in which $HfO_2$ is the high-κ gate dielectric, the modified high-κ gate dielectric may include hafnium and oxygen as the primary components and silicon and tantalum or another refractory metal as the secondary components.

The modified gate dielectric stacks described herein may lack a stoichiometrically precise composition. The modified gate dielectric stack may, therefore, be characterized by molecular ratios of the primary components to the secondary components. In some embodiments, the molecular ratios of either primary component (e.g. Hf or $O_2$) to either secondary component (e.g., Ta or Si) exceeds a threshold value. The precise threshold value is an implementation detail, but the threshold value for at least some embodiments is greater than or equal to 10. As an example, for gate dielectric stacks in which Hf and $O_2$ are the primary components and Ta and Si are the secondary components, each of the following molecular ratios exceeds a threshold value and the threshold value may be in the range of approximately 8 to approximately 12 or higher: Hf:Ta, Hf:Si, $O_2$:Ta, and $O_2$:Si. The modified high-κ dielectric stack may be represented by an approximated chemical composition designation. For $HfO_2$ gate dielectrics that have been modified with TaSiN as described above, the composition of the modified gate dielectric stack may be indicated as ~Hf(TaSi)$O_2$, where "~" indicates that the composition is not Stoichiometrically precise.

In another aspect, a disclosed semiconductor fabrication method includes forming a transistor gate dielectric on a semiconductor substrate by forming a high-κ metal-oxide film on the semiconductor substrate, incorporating a refractory metal silicon nitride within the high-κ metal-oxide film, and annealing the refractory metal silicon nitride and the high-κ metal-oxide film in an oxygen-bearing ambient. The method may include forming a transistor gate electrode by forming an electrically conductive transistor gate layer overlying the transistor gate dielectric, and patterning the gate layer to form a transistor gate electrode.

Forming the high-κ metal-oxide film may include a dual-step film formation process, in which the refractory metal silicon nitride is deposited between the two film formation steps, or a single-step film formation process, in which the refractory metal second nitride is implanted or otherwise introduced after the film is formed. For example, the dual-step film formation process may include depositing a first portion of the metal-oxide film prior to incorporating the refractory metal silicon nitride and depositing a second portion of the metal-oxide film after incorporating the refractory metal silicon nitride. Depositing the first portion or the second portion of the metal-oxide may be by atomic layer deposition, physical vapor deposition, or another suitable process. Incorporating the refractory metal silicon nitride may be achieved by depositing the refractory metal silicon nitride using an atomic layer deposition process, a physical vapor deposition process, or another suitable process.

An implementation of the single step film formation process might include depositing, in a single deposition, the metal-oxide film using atomic layer deposition process, physical vapor deposition, or another suitable deposition process and thereafter incorporating the refractory metal silicon nitride into the metal-oxide film using one or more ion implantation steps to introduce a refractory metal species, a silicon species, and/or a nitrogen species.

Turning now to the drawings, FIG. 1 depicts a partial cross-sectional view of a semiconductor substrate 101. Semiconductor substrate 101 as depicted in FIG. 1 may represent a portion of a semiconductor wafer that is not fully depicted. Semiconductor substrate 101 may be a monocrystalline silicon substrate. Semiconductor substrate 101 may be a silicon-on-insulator (SOI) substrate that includes an insulating layer such as a buried oxide layer (BOX) layer within a semiconductor substrate. In other embodiments, semiconductor substrate 101 may include one or more epitaxial layers of semiconductor or other materials deposited or formed on a substrate bulk of silicon or another conductive, semi-conductive, or electrically insulating material. Semiconductor substrate 101 may include various intrinsically doped semiconductor regions. Semiconductor substrate 101 may also include or be comprised primarily of semiconductor materials or elements other than silicon.

Figure 2:
FIG. 2 depicts processing subsequent to FIG. 1 in which a first layer of a dielectric stack has been formed on the semiconductor substrate.
Figure 3:
FIG. 3 depicts processing subsequent to FIG. 2 in which a second layer of the dielectric stack is formed on the first layer.
Figure 4:
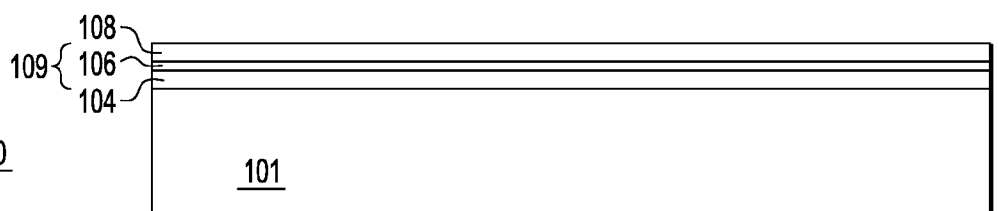
FIG. 4 depicts processing subsequent to FIG. 3 in which a third layer of the dielectric stack is formed on the second layer.
Figure 5:
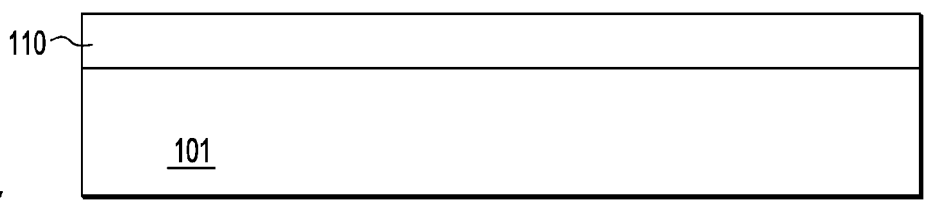
FIG. 5 depicts processing subsequent to FIG. 4 in which the first layer, the second layer, and the third layer are annealed to form an integrated gate dielectric stack.
Figure 6:
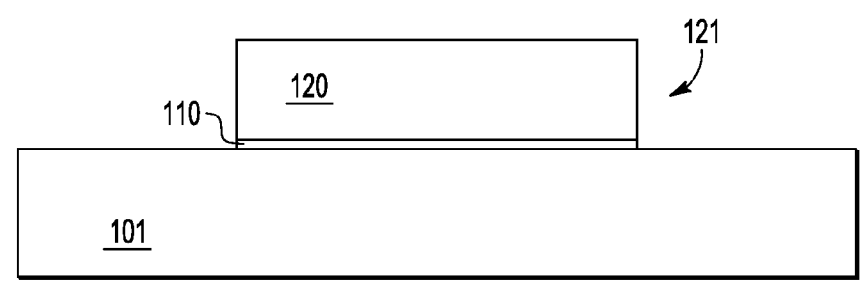
FIG. 6 depicts processing subsequent to FIG. 5 in which a gate electrode is formed and patterned overlying the gate dielectric.

Referring now to FIG. 2 through FIG. 5, selected stages in the formation of gate dielectric stack 109, depicted in FIG. 4, and a modified gate dielectric stack 110, depicted in FIG. 5, are shown. Referring to FIG. 2, a first layer 104 of the gate dielectric stack is formed on semiconductor substrate 101. In some embodiments, first layer 104 is formed of a high-κ dielectric material.

In some embodiments, first layer 104 is or is primarily comprised of a high-κ metal-oxide material. A metal-oxide material, as its name suggests, refers to a compound that includes oxygen and a metal element. In some embodiments, the high-κ metal-oxide material for first layer 104 is $HfO_2$.

The formation of first layer 104 may include the use of an atomic layer deposition (ALD) process. In one exemplary embodiment suitable for use with a $HfO_2$ implementation of first layer 104, the ALD process used to form first layer 104 includes performing a multi-phase deposition cycle one or more times. Each deposition cycle may add a monolayer or less of the metal-oxide.

The ALD deposition cycle may include (i) a metal phase during which a metal-containing precursor is pulsed into a deposition chamber containing semiconductor substrate 101, (ii) a purge phase during which unreacted metal precursor is purged using, as examples, nitrogen or argon, (iii) an oxygen phase during which an oxidant is pulsed into the chamber, and (iv) a purge phase during which unreacted oxidant is purged from the chamber, again using argon, nitrogen, or another suitable species. The deposition cycle may be repeated to obtain a desired film thickness. In some embodiments, ALD HfO.sub.2 is deposited on an RCA-cleaned Si substrate at 300 C using HfCl4 as a metal precursor and D2O as the oxidant.

The thickness of first layer 104 may depend upon the dielectric constant of the dielectric material used. For embodiments in which first layer 104 is comprised of $HfO_2$, for example, a thickness of first layer 104 may be less than approximately 5.0 nanometers. In other embodiments, the thickness of first layer 104 may be approximately 2.2 to 2.8 nanometers for a $HfO_2$ first layer 104. When ALD is used to form first layer 104, the thickness of the layer is controlled by the number of cycles.

Referring now to FIG. 3, a second layer 106, also referred to herein as a modifying film 106, is shown formed on or overlying first layer 104. In some embodiments, second layer 106 includes a refractory metal material and silicon or another second material. The refractory metal material, in some embodiments, may be selected from any number of refractory metals including Ta, Nb, Mo, W, or Re. The second material of second layer 106 may include a semiconductor element such as silicon. In still other embodiments, second layer 106 may include three elements, namely, the refractory metal material, a silicon element, and an inert or sacrificial third element such as nitrogen. In this embodiment, the formation of the second layer 106 may include the deposition of tantalum silicon nitride (TaSiN).

The formation of second layer 106 may include the physical vapor deposition (PVD) of a TaSiN layer. In these embodiments, the PVD of second layer 106 may include placing wafer semiconductor substrate 101 and first layer 104 in a chamber containing one or more tantalum targets, one or more silicon targets and bombarding the target(s) with highenergy ions, which may diffuse to the wafer under the influence of an AC, DC, or magnetic field.

In sputter deposition embodiments, a plasma discharge generated in proximity to the target wafer bombards the target wafer with the desired material. In some embodiments, the formation of second layer 106 includes performing a PVD process for a duration of less than approximately 8 to 12 seconds. In some embodiments, the formation of second layer 106 is designed to produce a film having a thickness of less than a monolayer of the material. In the case of TaSiN, the formation of second layer 106 may include performing a PVD process for a duration of approximately 1 second or less. In these embodiments, the semiconductor substrate 101 may be maintained at an ambient temperature of approximately 250 to 300 degrees and a pressure in the range of approximately 5 mTorr-50 mTorr. The deposition chamber may include a plasma discharge generated by a radio frequency (RF) electric field between two electrodes.

Turning now to FIG. 4, a third layer 108 is depicted formed overlying second layer 106. In some embodiments, first layer 104, the second layer 106, and third layer 108 are collectively referred to as a dielectric stack 109. The third layer 108 of dielectric stack 109 may include a high-κ dielectric material. The high-κ dielectric material in third layer 109 may be the same as the high-κ dielectric material used in the formation of first layer 104.

In embodiments that employ $HfO_2$ as the first layer 104, the third layer 109 may also include $HfO_2$. In some embodiments that use the same material for first layer 104 and third layer 108, the formation process for depositing or otherwise forming first layer 104 and the formation process for third layer 108 may be the same or substantially similar. In some embodiments, the thickness of third layer 108 may be less than the thickness of first layer 104.

In implementations where first layer 104 has a thickness of approximately 2.0 to 2.5 nanometers, for example, a suitable thickness for third layer 108 may be in the range of approximately 1.0 to 2.0 nanometers. Moreover, although the embodiment described with respect to FIG. 4 employs HfO.sub.2 for first layer 104 and HfO.sub.2 for third layer 108 other embodiments may employ a different material for first layer 104 and third layer 108. Similarly, other embodiments may employ different materials for first level layer 104 and third layer 108.

After the formation of third layer 108, dielectric stack 109 includes first and third layers 104 and 108 deposited or otherwise formed on either side of an intermediate second layer 106. In these embodiments, the first and third layers 104 and 108 may be high-κ dielectric materials and the thickness of second layer 106 may be a monolayer or less. In these embodiments, dielectric stack 109 may be comprised substantially of the material used for first layer 104 and third layer 108.

Although the formation of dielectric stack 109 as described above refers to the use of ALD for depositing the metal-oxide dielectric and PVD for depositing the refractory metal silicon nitride, other embodiments may use PVD for the metal-oxide dielectric deposition and/or ALD for the refractory metal silicon nitride deposition. Thus, the formation of dielectric stack 109 may include, as just two examples, ALD $HfO_2$+ PVD TaSiN+ALD $HfO_2$ or ALD $HfO_2$+ALD TaSiN+ALD $HfO_2$. With respect to implementations in which each layer is deposited using ALD, the entire stack may be formed without exposing semiconductor substrate 101 to ambient conditions, i.e., without breaking vacuum. In addition, the "all-ALD" sequence may be achieved with a cluster tool to improve throughput or cycle time.

When dielectric stack 109 includes, as it did with respect to the implementation depicted in FIG. 4, in which second layer 106 is less than a monolayer in thickness, second layer 106 may be included to alter or otherwise modify the electrical characteristics and performance of dielectric stack 109. In these embodiments, it may be desirable or necessary to include a high-temperature step to activate, diffuse, or otherwise integrate the second layer 106 into dielectric stack 109. For embodiments in which second layer 106 comprises TaSiN, the high temperature step may be represented by FIG. 5.

Referring to FIG. 5, semiconductor substrate 101 is depicted underlying modified gate dielectric stack 110. Modified gate dielectric stack 110 is depicted overlying semiconductor substrate 101. As depicted in FIG. 5, modified dielectric stack 110 is represented as a single film. Although this representation may suggest that modified dielectric stack 110 comprises a uniform or substantially uniform or homogenous film throughout its thickness, the actual composition and structure of modified gate dielectric stack 110 may be a modest function of the vertical position above the dielectric-substrate interface.

In some embodiments, the creation of modified dielectric stack 110 from dielectric stack 109 depicted in FIG. 4 is achieved using a post deposition anneal (PDA) process. The PDA process may include immersing semiconductor substrate 101 in an oxygen-bearing ambient maintained at a temperature of approximately 470 C to 530 C for a duration of approximately 50 to 70 seconds. In other embodiments, the anneal process may be more generally described as immersing wafer semiconductor substrate 101 in an oxygen-bearing ambient maintained at a temperature in the range of approximately 400 C to approximately 700 C for a duration in the range of approximately 10 to 500 seconds.

Modified dielectric stack 110 may include a non-stoichiometric composition of $HfO_2$ or another high-κ dielectric and tantalum or another a refractory metal material. In these embodiments, the integrated modified dielectric stack may be described as having non-stoichiometrically precise hafnium tantalum silicon dioxide. In these environments, the precise concentrations of hafnium, tantalum, silicon, and $O_2$ are not defined by the chemical composition, i.e., it is not a stoichiometric composition. Nevertheless, the composition of modified gate dielectric stack 110 may be described as including primary components such as the hafnium and oxygen necessary to form the underlying $HfO_2$. The primary elements may have a prevalence or density or concentration that substantially exceeds the concentration of the tantalum-bearing material.

Figure 7:
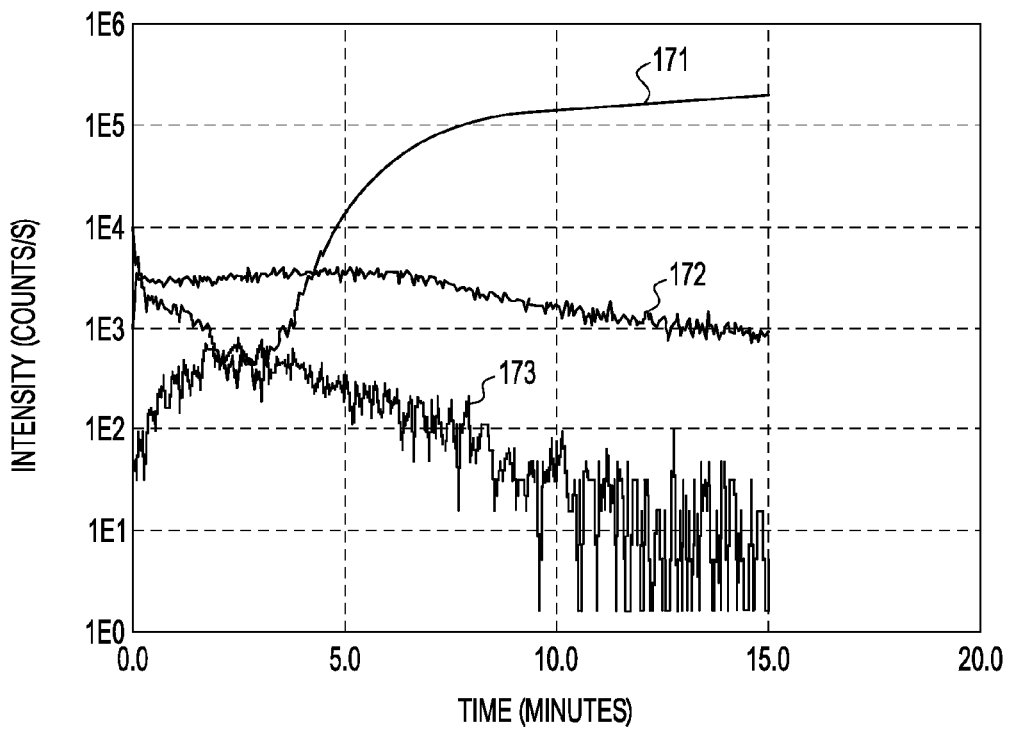
FIG. 7 is a first representation of a composition of one embodiment of the gate dielectric stack of FIG. 5.

Referring to FIG. 7, a representation of a composition of modified dielectric stack 110 from FIG. 5 of the preceding discussion is presented. FIG. 7 comprises a secondary ion mass spectrometry (SIMS) depth profiling representation.

As seen in FIG. 7, the SIMS representation of the composition of integrated modified gate dielectric 110 includes a first plot line 171 representing silicon, a second plotline 172 representing the high-κ metal material (hafnium), in this case, and a third plotline 173 depicting levels of tantalum or another refractory metal material used in dielectric stack 110.

The SIMS representations of the chemical composition of modified gate dielectric stack 110 illustrate the relative compositions of materials in integrated modified gate dielectric stack 110 on a plot that includes intensity on the vertical access and time on the horizontal access. Although the specific densities and compositions of the materials cannot be determined from the SIMS representation of FIG. 7 and FIG.

Figure 8:
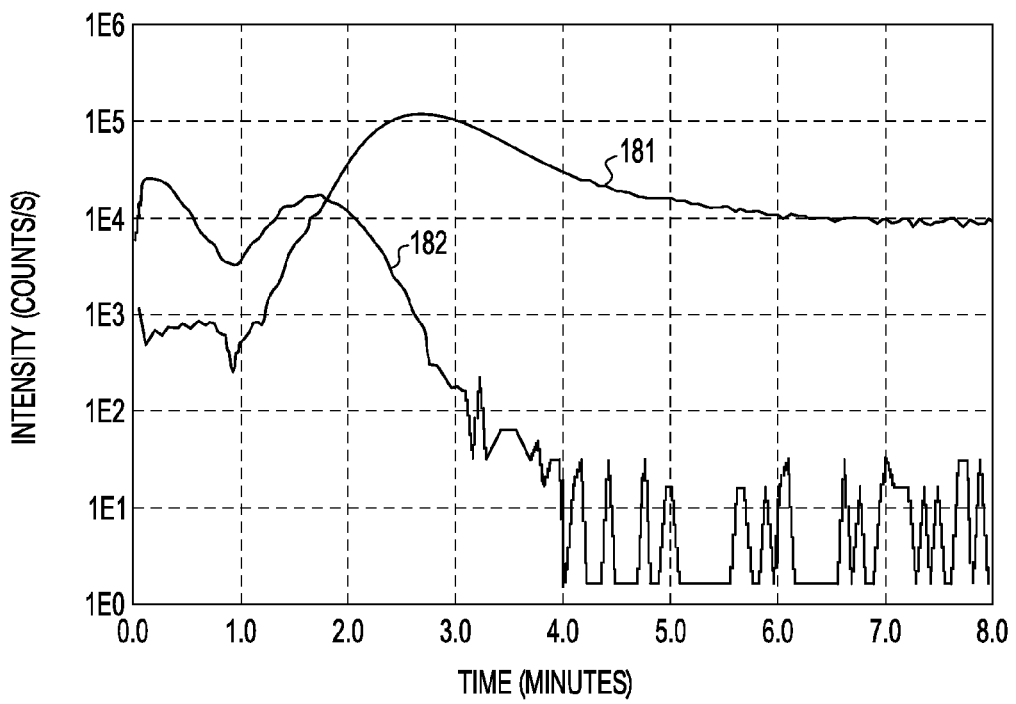
FIG. 8 is a second representation of a composition of the gate dielectric stack in FIG. 5.

8, FIG. 7 and FIG. 8 are useful for observing qualitative aspects of the film's composition.

For example, the embodiments of modified gate dielectric stack 110 as represented in FIG. 7 include a silicon intensity that rises rapidly from relatively low levels at time 0. The second plot line 172 depicts levels of hafnium throughout the film thickness. Whereas silicon plotline 171 depicts the concentration intensity of Si varying widely with respect to the other materials throughout the film thickness, the relative concentration of hafnium remains relatively stable from the initial time at the leftmost axis through a time of approximately 5 minutes. FIG. 7 still further depicts a third plot 173 representing the refractory metal material. In some embodiments, the concentration of tantalum or other refractory metal represented by third plotline 173 is below the intensity of first and second plotlines 171 and 172 respectively. FIG. 7 depicts the relative concentration of tantalum, represented by reference numeral 173, increasing from time 0 to approximately time 2.5 minutes and thereafter decreasing to an intensity that is difficult to measure.

Referring to FIG. 8, a second plot illustrates a relative intensity of oxygen and silicon in the modified dielectric stack. In the embodiment depicted in FIG. 8, a first plot line 181 depicts the relative concentration of silicon from time 0 to time in excess of eight minutes. First plotline 181 as depicted in FIG. 8 illustrates the intensity of silicon being substantially less than the intensity associated with oxygen from the interval between time zero to three minutes. After this initial time, the relative intensity of silicon greatly exceeds the rapidly decreasing intensity associated with the oxygen plot 182.

Although the X axis in FIG. 7 and FIG. 8 is measured in terms of time, it will be appreciated by those of skill in the field of semiconductor fabrication that the time represented in FIG. 7 then FIG. 8 is roughly proportional to a film depth. Under this assumption, the SIMS plots of FIG. 7 and FIG. 8 may indicate the relative intensities or relative concentrations of the applicable elements or materials as a function of depth within the integrated modified dielectric stack 110.

From FIG. 7 and FIG. 8, it may be concluded that the composition of integrated modified gate dielectric stack 110 may include primary materials or elements including, in this example, silicon represented by plotline 171 in FIG. 7 and oxygen represented by plotline 182 in FIG. 8. The prevalence of silicon and oxygen is especially prominent in the early time periods i.e. with respect to the earliest or shallowest depths. As the depth increases (i.e. the distance from the dielectric substrate interface increases, the level of silicon ultimately rises rapidly and predominates.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor fabrication method, comprising:
   forming a gate dielectric stack on a substrate, wherein forming the gate dielectric stack includes:
   depositing a first layer of a metal-oxide dielectric on the substrate;
   forming a modifying film over the first layer, the modifying film comprising a refractory metal and a semiconductor element, wherein the refractory metal comprises tantalum and the semiconductor element comprises silicon; and
   after forming the modifying film, depositing a third layer over the modifying film, the third layer comprising a second layer of the metal-oxide dielectric; and
   annealing the gate dielectric stack.

2. The method of claim 1, wherein the first layer of the metal-oxide dielectric has a dielectric constant exceeding 10.

3. The method of claim 1, wherein depositing the first layer includes depositing a first layer of $HfO_2$.

4. The method of claim 1, wherein:
   depositing the first layer comprises depositing the first layer by a deposition process selected from an atomic layer deposition process and a physical vapor deposition process;
   forming the modifying film includes forming the modifying film by a deposition process selected from an atomic layer deposition process and a physical vapor deposition process; and
   depositing the third layer comprises depositing the third layer by a deposition process selected from an atomic layer deposition and a physical vapor deposition.

5. The method of claim 4, wherein:
   depositing the first layer comprises depositing the first layer by an atomic layer deposition process at a temperature of approximately 300 C;
   forming the modifying film by a physical vapor deposition process; and
   depositing the third layer comprises depositing the third layer by an atomic layer deposition process.

6. The method of claim 1, wherein depositing the first layer comprises depositing the first layer to a thickness of approximately 2.2 to 2.8 nanometers.

7. The method of claim 6, wherein depositing the third layer comprises depositing the second layer to a thickness of approximately 1.2 to 1.7 nanometers.

8. The method of claim 7, wherein forming the modifying film comprises forming a sub-monolayer of a film comprising: the refractory metal, silicon, and nitrogen.

9. The method of claim 1, wherein forming the modifying film includes forming a TaSiN film.

10. The method of claim 1, wherein forming the modifying film includes performing a physical vapor deposition of the modifying film.

11. The method of claim 10, wherein forming the modifying film includes performing the physical vapor deposition for less than approximately 10 seconds.

12. The method of claim 11, wherein forming the modifying film includes performing the physical vapor deposition for approximately 1 second.

13. The method of claim 1, wherein a ratio of the metal-oxide to the refractory metal and a ratio of the metal-oxide dielectric to the semiconductor element are greater than a threshold value, wherein the threshold values is approximately equal to 10.

14. The method of claim 1, wherein annealing the gate dielectric stack includes annealing the gate dielectric stack in an oxygen-bearing ambient at a temperature of in a range of approximately 720 C to approximately 780 C for a duration of less than approximately 10 minutes.

15. The method of claim 1, wherein annealing the gate dielectric stack includes annealing the gate dielectric stack in an oxygen-bearing ambient at a temperature in a range of approximately 470 C to 530 C for a duration in the range of approximately 50 seconds to 70 seconds.

16. The method of claim 1, wherein the modifying film comprises the refractory metal, the semiconductor element, and nitrogen and further wherein the semiconductor element is silicon.

17. A semiconductor fabrication method, comprising:
forming a transistor gate dielectric on a semiconductor substrate, said forming comprising:
forming a high-K metal-oxide film on the semiconductor substrate;
incorporating a modifying film including a refractory metal and a semiconductor element within the high-K metal-oxide film; and
annealing the modifying film and the high-K metal-oxide film in an oxygen-bearing ambient;
annealing the transistor gate dielectric;
forming an electrically conductive transistor gate layer overlying the transistor gate dielectric; and
patterning the gate layer to form a transistor gate electrode;
wherein forming the high-K metal-oxide film comprises:
prior to incorporating the modifying film, depositing a first portion of the high-K metal-oxide film using a deposition process selected from an atomic layer deposition process and a physical vapor deposition process; and
after incorporating the modifying film, depositing a second portion of the high-K metal-oxide film using a deposition process selected from an atomic layer deposition process and a physical vapor deposition process.

18. The semiconductor fabrication method of claim 17, further comprising:
incorporating the modifying film comprises depositing the modifying film using a deposition process selected from an atomic layer deposition process and a physical vapor deposition process.

* * * * *